United States Patent
Han et al.

(10) Patent No.: US 6,986,971 B2
(45) Date of Patent: Jan. 17, 2006

(54) REFLECTIVE MASK USEFUL FOR TRANSFERRING A PATTERN USING EXTREME ULTRAVIOLET (EUV) RADIATION AND METHOD OF MAKING THE SAME

(75) Inventors: Sang-In Han, Phoenix, AZ (US); Scott Daniel Hector, Austin, TX (US); Pawitter J. S. Mangat, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 148 days.

(21) Appl. No.: 10/290,693

(22) Filed: Nov. 8, 2002

(65) Prior Publication Data

US 2004/0091789 A1 May 13, 2004

(51) Int. Cl.
*G01F 9/00* (2006.01)

(52) U.S. Cl. .......................................... 430/5
(58) Field of Classification Search ............. 430/5, 430/322, 323; 378/34, 35
See application file for complete search history.

(56) References Cited

U.S. PATENT DOCUMENTS

| | | | |
|---|---|---|---|
| 5,052,033 A | 9/1991 | Ikeda | |
| 5,521,031 A | 5/1996 | Tennant | |
| 5,641,593 A | 6/1997 | Watanabe | |
| 5,939,227 A | 8/1999 | Smith | |
| 6,392,792 B1 | 5/2002 | Naulleau | |
| 6,641,959 B2 * | 11/2003 | Yan | 430/5 |
| 6,645,679 B1 | 11/2003 | La Fontaine et al. | |
| 6,653,053 B2 | 11/2003 | Mangat et al. | |
| 2001/0051304 A1 * | 12/2001 | Stivers et al. | 430/5 |
| 2002/0192571 A1 * | 12/2002 | Schwarzl | 430/5 |
| 2003/0039894 A1 * | 2/2003 | Yan et al. | 430/5 |

OTHER PUBLICATIONS

Cho et al., "Fabrication of Attenuated Phase Shift Mask for EUV Lithography," Dept. of Electrical Engineering & Computer Science, Berkeley, CA, 14 pages.
Wood et al., "Use of Attenuated Phase Masks in Extreme Ultraviolet Lithography," American Vacuum Society, J. Vac. Sci. Technol. B 15(6), Nov./Dec. 1997, pp. 2448–2451.
Chen et al., "Simulation on a New Reflection Type Attenuated Phase Shifting Mask for Extreme Ultraviolet Lithography," Part of the SPIE Conference on Emerging Lithographic Technologies III, SPIE vol. 3676, Mar. 1999, pp. 578–586.
Mangat et al., "EUV Mask Fabrication with Cr Absorber," Reprinted from Emerging Lithographic Technologies IV, Proceedings of SPIE, vol. 3997, pp. 76–82.
Vernon et al., "Masks for Extreme Ultraviolet Lithography," Part of the BACUS Symposium on Photomask Technology & Management, SPIE vol. 3546, Sep. 1998, pp. 184–193.
Han, Sang–In et al.; "Novel Design of Att–PSM Structure for Extreme Ultra Violet Lithography and Enhancement of Image Contrast during Inspection"; 14pp.; Motorola DigitalDNA™ Laboratories, Austin, TX, USA. (Feb. 27, 2002).

* cited by examiner

*Primary Examiner*—S. Rosasco
(74) *Attorney, Agent, or Firm*—Kim-Marie Vo; Patricia S. Goddard

(57) ABSTRACT

An EUV mask (10) includes an opening (26) that helps to attenuate and phase shift extreme ultraviolet radiation using a subtractive rather than additive method. An etch stop layer (20) may be provided between a lower multilayer reflective stack (14) and an upper multilayer reflective stack (22) to ensure an appropriate and accurate depth of the opening. An absorber layer (32) may be deposited within the opening to sufficiently reduce the amount of reflection within dark region (30). Optimal thicknesses and locations of the various layers are described.

29 Claims, 4 Drawing Sheets

REFLECTIVE MASK USEFUL FOR TRANSFERRING A PATTERN USING EXTREME ULTRAVIOLET (EUV) RADIATION AND METHOD OF MAKING THE SAME

RELATED APPLICATIONS

This application is related to U.S. patent application Ser. No. 09/940,241 filed Aug. 27, 2001, entitled "Method of Forming a Pattern on a Semiconductor Wafer Using an Attenuated Phase Shifting Reflective Mask" and assigned to the current assignee hereof. This application is related to U.S. patent application Ser. No. 09/939,184 filed Aug. 24, 2001, entitled "Method of Making an Integrated Circuit Using a Reflective Mask" and assigned to the current assignee hereof and incorporated herein by reference. This application is related to U.S. patent application Ser. No. 09/414,735 filed Oct. 8, 1999, entitled "Method of Manufacturing a Semiconductor Component" and assigned to the current assignee hereof and incorporated herein by reference.

FIELD OF THE INVENTION

The invention relates, generally, to semiconductor manufacturing and more particularly to extreme ultra-violet (EUV) lithography.

BACKGROUND OF THE INVENTION

Currently, transmission optical photolithography is used to form patterned layers in semiconductor manufacturing. Since the ability to resolve the semiconductor device features during photolithography is directly proportional to the wavelength of the light source, the wavelength of the light source needs to decrease as device dimensions decrease. To pattern device dimensions less than approximately 70 nanometers, one option is to use a light source with a wavelength in the extreme ultra-violet (EUV) regime. As used herein, the EUV regime has a characteristic wavelength between approximately 4–25 nanometers and more specifically, between 13–14 nanometers. Since it is difficult to find a material that transmits EUV radiation when exposed to wavelengths in the EUV regime, EUV lithography operates in a reflective mode as opposed to the transmission mode. Hence, EUV masks are reflective in nature and are not transmissive like the masks for optical photolithography or other technology options such as electron projection lithography or ion projection lithography.

Typically, an additive process is performed to fabricate an EUV mask. In this process, layers are formed and patterned over a reflective layer, which is formed on a mask substrate. Each additional layer that is formed and patterned requires deposition and patterning processes that increase the complexity of manufacturing the EUV mask. Thus, a need exists for an EUV mask that is capable of patterning small device features on a semiconductor wafer that is formed by a simplified manufacturing process.

BRIEF DESCRIPTION OF THE DRAWINGS

The present invention is illustrated by way of example and not limitation in the accompanying figures, in which like references indicate similar elements, and in which.

Figure 1:
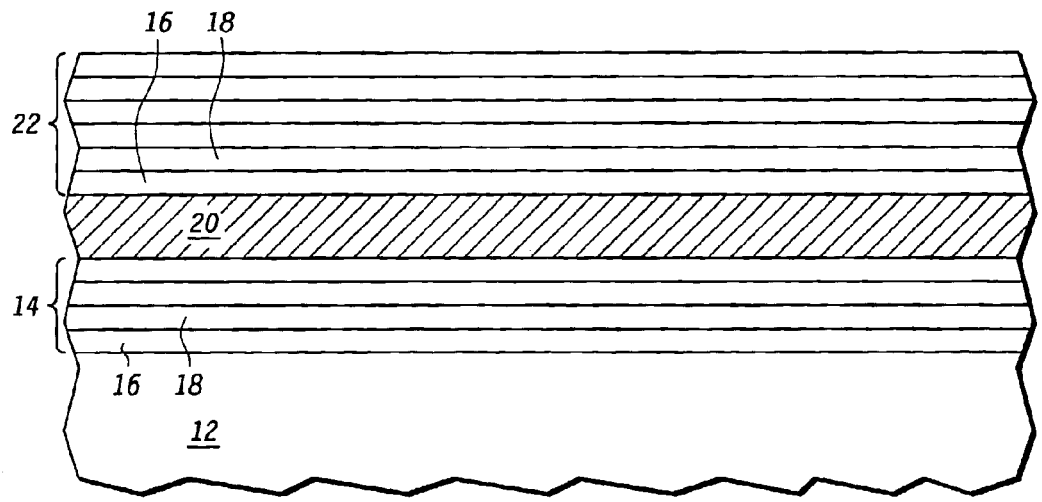
FIG. 1 illustrates a portion of an EUV mask substrate having a lower multilayer reflective stack, an etch stop layer, and an upper multilayer reflective stack in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Instead of forming and patterning multiple layers over a reflective layer on a mask substrate (i.e., an additive mask fabrication process) to manufacture an EUV mask, it is desirable to pattern the reflective layer itself (i.e., a subtractive process). In a preferred embodiment, the reflective layer is a multilayer reflective stack of alternating materials. To pattern the reflective layer, an etch stop layer (ESL) is embedded within the reflective layer. The reflective layer is patterned and etched to form an opening using a chemistry that is selective to the ESL. Hence, the ESL is exposed once the opening is formed. Since it is desirable that the reflectivity of the radiation from the top of the opening be minimized in one embodiment, an absorber is formed within the opening. The absorber is desired if an attenuated phase shifting mask (APSM) is being fabricated, but preferably is not formed if a hard phase shift mask (HPSM) is being fabricated.

Both the HPSMs and the APSMs are reflective masks that utilize the phase information of light during exposure in a lithographic process. However, each of the APSM and HPSM form patterns using different parameters of light and thus, each mask has its own unique lithographic applications. The APSM forms a pattern that has dark regions that block light, bright regions that reflect light, and an absorber region that is 180 degrees out of phase with the light reflected from the bright regions. Since some light is reflected from the absorber region, this small intensity of light destructively interferes with the unshifted light reflected from the reflective region, thereby creating a sharper image to be patterned. The APSM mask has advantages in printing isolated spaces or contact holes, instead of lines.

The HPSM uses destructive interference at the boundaries of two regions, which are designed so that light from each region is 180 degrees out of phase with each other, to provide contrast to form a pattern in a photoresist layer. It is desirable to use the HPSM to print dense lines or repetitive structures and very small isolated lines, which all require an obstruction of light during exposure. For an ideal situation, the ratio of the light intensity between the two regions, is 1, meaning both are equally bright. In reality, the ratio could be less than 1. For example, a ratio of 0.85 is still effective for printing.

First, a method for forming the APSM will be described in regards to FIGS. 1–6 and how to use the APSM to form a semiconductor device will be explained in regards to FIG. 6. Next, any changes to the process for forming an APSM that are employed to form the HPSM, will be described. In addition, using the HPSM to form a semiconductor device will be discussed in regards to FIG. 7. However, both the APSM and HPSM are formed using a process with an embedded ESL.

Shown in FIG. 1 is the starting point for forming an EUV (reflective) mask 10, such as the APSM 10, which includes a (mask) substrate 12, a lower reflective stack 14, an etch stop layer (ESL) 20 and an upper reflective stack 22. In one embodiment, the substrate 12 is a low thermal expansion (LTE) material, which as used herein has (i) a coefficient of thermal expansion (CTE) of less than approximately 30 parts per million (ppm) per degree Kelvin between 19 and 23 degrees Celsius; (ii) a low defect density, which used herein is approximately less than 0 defects greater than approximately 50 nanometers Poly Styrene Latex (PSL) sphere equivalent and (iii) a low surface roughness, which used herein is less than approximately 50 nanometers flatness measured from a peak of a bump to a valley between the bump and an adjacent bump. In addition, the substrate 12 should be able to mechanically support any overlying layers during the manufacturing process of the mask and the fabrication process of the semiconductor device. In some embodiments, the mask substrate is a high quality ceramic, fused silica or another glass.

The lower reflective stack 14 is a reflective layer and in a preferred embodiment, has alternating layers of at least two different materials. Of the two different materials chosen, one should be highly transmissive to the wavelength of radiation incident on the APSM 10 during a lithographic process, and the other material should have an index of refraction different than that of the highly transmissive layer. The thickness and index of refraction of the pair of materials should be chosen to have the peak reflectivity for the wavelength of the EUV source. In one embodiment, the first alternating layer 16 is molybdenum and the second alternating layer 18 is silicon or vice versa for a radiation with a wavelength of 13.4 nanometers. In a preferred embodiment, the molybdenum is in contact with the substrate 12 so that the topmost layer of all the layers of a combined reflective stack is silicon (to be described in more detail below). In another embodiment, molybdenum and beryllium are used for the first alternating layer 16 and the second alternating layer 18 for radiation with a wavelength of 11.4 nanometers.

The upper reflective stack 22 is also a reflective layer, which in a preferred embodiment is a multilayer stack having alternating layers of at least two different materials. Preferably, the upper reflective stack 22 includes the first alternating layer 16 and the second alternating layer 18, which, in one embodiment, are molybdenum and silicon. However, the materials used for the upper multilayer reflective stack do not have to be the same materials used for the lower multilayer reflective stack. Silicon is desired to be the exposed layer of the combined reflective stack because the native silicon oxide layer that is formed does not undesirably absorb as much EUV light as molybdenum oxide, which inherently forms when molybdenum is exposed to an oxygen-containing environment. Furthermore, the preference of silicon dioxide to molybdenum oxide as the top layer has manufacturing advantages as well. Silicon dioxide on the surface of the silicon capping layer can be easily incorporated into the mask fabrication process or can be easily removed from the surface revealing fresh silicon surface by using well established fabrication processes such as wet or dry etching of silicon dioxide. However, if molybdenum is the topmost layer of the combined mask, an additional process is needed to form a capping layer over the molybdenum to prevent oxidation.

In a preferred embodiment, the lower reflective stack 14 and the upper reflective stack 22 together include a total of 40 layer pairs (periods) of a silicon layer and a molybdenum layer with a periodicity of about 7 nm, wherein a molybdenum layer is in contact with the substrate 12 and a silicon layer is the top layer of the upper multilayer reflective stack 22. The total number of layer pairs may exceed 40, but increasing the number of layer pairs greater than 40 provides diminishingly less improvement in optical performance of the multilayer stack. Additionally, a combined reflective stack, which includes the upper reflective stack 22 and the lower reflective stack 14, with less than 40 layer pairs may not have adequate reflectivity. In a preferred embodiment, the combined reflective stack 14 and 22 reflects at least 65% of incident light at a wavelength of 13–14 nm. For the fabrication of the combined reflective stack 14 and 22, ion beam deposition (IBD), magnetron sputtering, E-beam evaporation or the like can be used.

The ESL 20 is formed between the lower reflective stack 14 and the upper reflective stack 22. In other words, the ESL 20 is an embedded layer within the combined reflective stack 14 and 22. The number of periods in the lower reflective stack 14 and the upper reflective stack 22 is determined based on the reflectivity and desired amount of phase shifting of the ESL 20, as will be further explained below. The ESL 20 should have a high transmission of the wavelength of radiation to be used in the EUV lithographic process and a high etch selectivity to the materials chosen for the upper multilayer reflective stack 22. However, it is probable that the ESL 20 will absorb some light and therefore decrease the overall reflectivity of the lower multilayer reflective stack 14 and the upper multilayer reflective stack 22. In one embodiment, the ESL 20 includes chromium, ruthenium, chrome oxide, chrome nitride, boron carbide, zirconium, tantalum oxide, tantalum nitride, tantalum silicon nitride, the like, or combinations of the above formed by physical vapor deposition (PVD) (e.g., magnetron sputtering, ion beam sputtering), chemical vapor deposition (CVD), the like, or combinations of the above processes. The thickness of the ESL 20 ($t_{ESL}$) is determined using a calculation based on electromagnetic wave theory. EUV radiation incident on the APSM 10 is composed of electromagnetic waves. These waves are represented by electric and magnetic fields. When the electromagnetic waves are incident on an interface between two materials, such as the layers in the upper reflective stack 22 and the lower reflective stack 14, some of the incident radiation is reflected at the interface. The amount of radiation reflected can be calculated by determining the Fresnel coefficients at the interface between the two materials, as described in David Attwood, "Soft X-Rays and Extreme Ultraviolet Radiation", Cambridge University Press, 1999, Chapters 3 and 4. The Fresnel coefficients depend on the index of refraction of the two materials and the angle of incidence of the radiation. In the EUV spectrum, the index of refraction of materials can be calculated using quantum mechanical theory and researchers have tabulated the index of refraction values for most known elements, which can be found in B. L. Henke, E. M. Gullikson, and J. C. Davis, "X-Ray Interactions: Photoabsorption, Scattering, Transmission, and Reflection at E=50–30,000 eV, Z=1–92," Atomic Data and Nuclear Data Tables, volume 54, page 181, 1993.

If the combined reflective stack 14 and 22 is or is approximately to be one or two layers, the reflectivity of the radiation incident on the stack of materials that exists on the APSM 10 can be calculated at each interface using the Fresnel coefficients for that interface. In propagation to each interface, some of the radiation is absorbed, depending on how far the radiation has traveled through the stack of materials. The amount of radiation absorbed can be determined using the extinction coefficients for the materials in the combined reflective stack 14 and 22. The extinction coefficients for most elements are also tabulated and can be found in Henke et al.'s publication listed above. The radiation reflected from each interface propagates back toward the top of the stack of layers, and some is absorbed. Some of the radiation is also reflected at the interfaces it encounters in propagating back to the surface of the stack. To determine the total amount of radiation reflected by the stack of layers, the amount reflected at each interface that is not absorbed or reflected in propagating back to the surface of the stack of layers is determined.

The phase at the surface of the stack of materials of the radiation reflected from each interface is also determined using electromagnetic wave theory, the index of refraction of the materials in the stack, and the distance the wave traveled in each material. Electromagnetic waves constructively interfere when their phase is identical, and they destructively interfere when their phase differs by 180 degrees. They partially interfere when their phase difference is in between 0 and 180 degrees. The amount of interference is in proportion to the cosine of the difference in their phase. The total reflectivity of the stack of materials is determined by adding the amount of radiation reflected at each interface that also is not absorbed or reflected in returning to the surface of the stack. This addition also accounts for the phase of the radiation reflected at each interface.

However, in practice the combined reflective stack 14 and 22 and the ESL 20 are many layers and, thus a different approach should be taken to better calculate the reflectivity and phase of the EUV mask. In principle, the thickness of the ESL 20 ($t_{ESL}$) is determined by the equation below, which takes into account only a single ray of radiation reflected from a single layer:

$$t_{ESL} \cong (\lambda * \cos \theta)/(2 * n_{ESL}) \quad \text{(equation 1)}$$

wherein $\lambda$ is the wavelength of radiation of the EUV lithographic process, $n_{ESL}$ is the index of refraction of the ESL 20, $\theta$ is the angle of incidence of the radiation incident on the mask with respect to the perpendicular axis. Since in reality the light incident on the APSM 10 is reflected back by many layers (i.e., the layers in the combined reflective layer 14 and 22 and the ESL 20), a matrix method can be used to calculate the reflectivity and phase shifting of the combined reflective layer 14 and 22 and the ESL 20. To easily handle the matrix algebra it is desirable to use a computer program. The combined reflective layer 14 and 22 includes N layers, wherein each of the N layers has a thickness denoted as d1, d2, d3, . . . dN that is used in the following equation:

$$\begin{bmatrix} E(0) \\ H(0) \end{bmatrix} = [M_1(d1)][M_2(d2)][M_3(d3)] \cdots \quad \text{(equation 2)}$$

$$[M_N(dN)] \begin{bmatrix} E(d1+d2+d3 \ldots dN) \\ H(d1+d2+d3 \ldots dN) \end{bmatrix}$$

$$= [M] \begin{bmatrix} E(d1+d2+d3 \ldots dN) \\ H(d1+d2+d3 \ldots dN) \end{bmatrix},$$

wherein each matrix $[M_x(d_x)]$, where x is 1, 2, 3, . . . N, is:

$$[M_x(d_x)] = \begin{bmatrix} \cos\beta_x d_x & i\frac{1}{g_x}\sin\beta_x d_x \\ ig_x\sin\beta_x d_x & \cos\beta_x d_x \end{bmatrix} \quad \text{(equation 3)}$$

$\beta$ is the propagation constant ($2\pi n/\lambda$) in the medium with an index of refraction n and g is the intrinsic admittance of the material $\left( \sqrt{\frac{\varepsilon}{\mu}} \right.$, here $\varepsilon$ is the electric permittivity of the layer and $\mu$ is permeability of the layer $\left. \right)$.

A skilled artisan recognizes that i is used to denote a complex number, E is the electric field amplitude and H is the magnetic field amplitude.

Equations 2–3 assume that the light incident on the APSM 10 is incident normal to the APSM 10. However, if the light is incident on the combined reflective stack 14 and 22 at an oblique angle φ, the characterization matrix of equation 3 needs to be modified due to optical path length difference for different states of polarization. For s-polarization, meaning the orientation of the electric field is perpendicular to the plane of the incident light, the intrinsic admittance g and the propagation constant β need to be replaced in equations 2 and 3 by gcosφ and β cos φ), respectively. For p-polarization, where the orientation of electric field is in the same plane as the incident light, intrinsic admittance g and the propagation constant β need to be replaced in equations 2 and 3 by g/cos φ and β cos φ, respectively. In the preferred embodiment, the angle of the incident light is 5 degrees normal to the APSM 10 based on the tool configuration as will be described in regards to FIGS. 6 and 7. Since the angle is close to zero there is not much difference between the calculations when the radiation is perpendicular to the APSM 10 and for the preferred embodiment, where the radiation is 5 degrees normal to the APSM 10.

By solving for the characterization matrix of the combined reflective stack 14 and 22, the reflective coefficient, from which reflectivity and phase angle is determined, is calculated. The result of equation 2, is a two by two matrix, [M], represented as:

$$[M] = \begin{bmatrix} m_{11} & m_{12} \\ m_{21} & m_{22} \end{bmatrix}, \quad \text{(equation 4)}$$

From [M], the reflection coefficient r can be determined using:

$$r = \frac{\frac{1}{g_s}m_{11} + m_{12} - \frac{1}{g_o g_s}m_{21} - \frac{1}{g_o}m_{22}}{\frac{1}{g_s}m_{11} + m_{12} + \frac{1}{g_o g_s}m_{21} + \frac{1}{g_o}m_{22}} \quad \text{(equation 5)}$$

where $g_s$ is the intrinsic admittance of the top material of the upper reflective stack 22 and $g_o$ is the intrinsic admittance of the bottom material of the lower reflective stack 14.

Once r is determined using equation 5, the reflectivity (or the power reflection coefficient) can be calculated as the square of the absolute value of the complex form of the reflective coefficient r using time averaged Poynting vectors for the incident and the reflected waves (light):

$$R = \frac{(-\vec{z}) \cdot \langle \vec{S}_r \rangle}{(\vec{z}) \cdot \langle \vec{S}_i \rangle} = |r|^2 \qquad \text{(equation 6)}$$

wherein $\vec{z}$ is the reference direction of the unit vector, $\vec{S}_r$ is the time averaged Poynting vector for the reflected light, and $\vec{S}_t$ is the time averaged Poynting vector for the incident light.

To determine the phase angle, the argument of the complex coefficient of the reflective coefficient can be determined since the reflective coefficient has a complex form. The argument of a complex coefficient is the calculation of angles of a complex number (i.e., the reflective coefficient) relative to the positive real axis in the complex plane. The above equations are used to determine the thickness of the ESL 20 and the location of the ESL 20 (i.e., how many layers the upper reflective stack 22 and the lower reflective stack 14 include). In an embodiment, where chromium is chosen as the ESL 20, which has an index of refraction of approximately 0.933, the thickness of the ESL 20 is calculated to be approximately 6 nm, provided radiation with a wavelength of 13.4 nm and incident on the EUV mask at 5 degrees is used. In general, the optimum thickness of ESL is smaller than the value calculated from equation 1 due to attenuation of wave amplitude when the ESL 20 is beneath many layers of the upper multilayer stack 22. The thickness of the ESL is chosen to provide the maximum reflectivity when it is embedded inside the combined reflective stack 14 and 22.

Using the above equations, a plot can be generated that illustrates 6 nm of chromium for the ESL 20 embedded at different positions. Based on the graph, it is determined that 6 nm of chromium provides peak reflectivity without changing the reflectivity of the combined reflective stack 14 and 22 if the ESL 20 is embedded twenty (20), twenty-five (25) and thirty (30) periods from the top of the combined reflective stack 14 and 22). The reflectivity of the combined reflective stack 14 and 22 is more sensitive when the ESL 20 is embedded closer to the top of the combined reflective stack (i.e., 20 periods from the top) as compared to when it is embedded deeper into the combined reflective stack 14 and 22 (i.e., 30 periods from the top). The thickness of the ESL 20 is kept constant, so it is the position of the ESL 20 in the combined reflective stack that is optimized for the required amount of attenuation and phase shift. As will be described in more detail below, the phase shift between the combination of the combined reflective stack 14 and 22 and ESL 20 and the combination of the lower reflective stack 14 and the ESL 20 should be 180 degrees, because portions of the upper reflective stack 22 are removed on the APSM 10 so that patterning using the EUV mask is successful. However, embedding the ESL 20 twenty (20), twenty-five (25) or thirty (30) periods from the top of the combined reflective stack 14 and 22 does not achieve the desired reflectivity, attenuation and, especially, the phase shift. Thus, the ESL 20 must be embedded within the combined reflective stack 14 and 22 below a different number of periods, which is desirably close to twenty (20), twenty-five (25) or thirty (30) periods. Fortunately, when embedding 6 nm of chromium within 26 periods of the combined reflective stack 14 and 22, the phase shifting requirement is achieved without a negative effect on reflectivity. Therefore, in one embodiment, the upper reflective stack 22 has 26 periods. Since, as previously explained, it is desirable for the combined reflective stack 14 and 22 to have 40 periods, the lower reflective stack 14 has 14 periods. These parameters for the ESL 20 also provide the desired reflectivity between a portion of the APSM 10 where the upper reflective layer 22 will be removed and areas where it will not be removed, as will be explained below.

Figure 2:
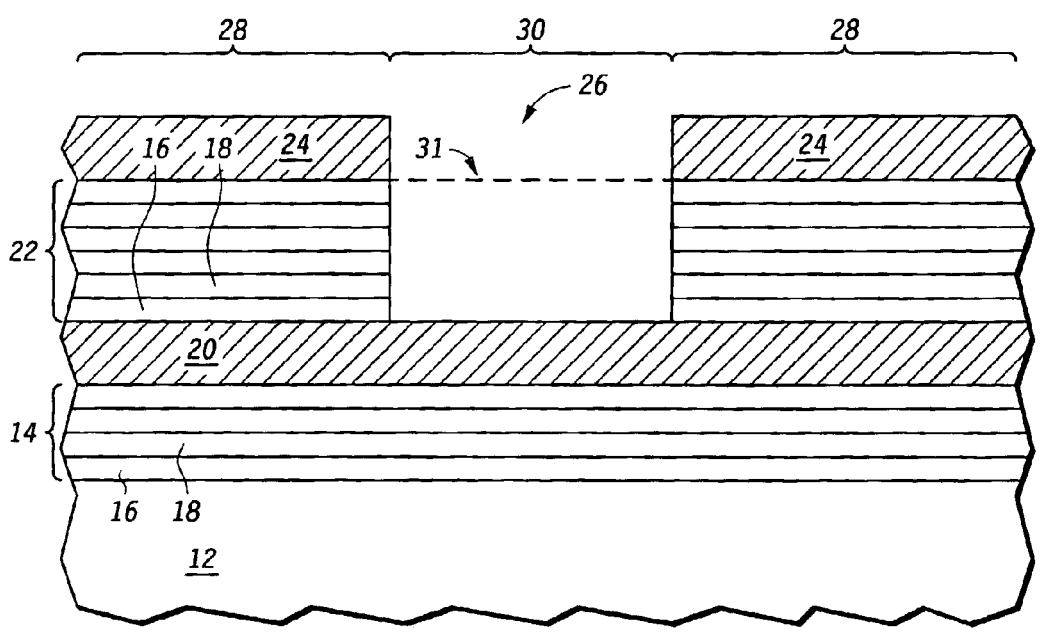
FIG. 2 illustrates the portion of the EUV mask of FIG. 1 after etching a portion of the upper multilayer reflective stack.

As shown in FIG. 2, after forming the lower reflective stack 14, the ESL 20, and the upper reflective stack 22, a mask 24 is patterned to form an opening 26 in the upper reflective stack 22. In a preferred embodiment, the mask 24 is a hardmask of approximately 20–300 nm of chrome, ruthenium, any dielectric film formed by PVD, CVD, the like, or combinations of the above. Alternatively, the mask 24 can be photoresist, which may result in the sidewalls of the opening 26 to be sloped. However, a hardmask of chrome or another suitable material is preferred as to form substantially vertical sidewalls for the opening 26. Inspection and repair of the hardmask 24 can be done after the hardmask 24 has been etched and before etching the upper reflective stack 22. Inspection and repair are processes that find and fix defects in the hardmask 24 to avoid the defects from being transferred to the upper reflective stack 22. After inspection and repair (if performed), the upper multilayer reflective stack 22 is patterned to form the opening 26, which stops on the ESL 20, thereby exposing the ESL 20 in the opening 26. In other words, the opening is formed partially through the combined reflective stack 14 and 22. A top plane 31 of the opening 26 is coplanar with the top surface of the combined reflective stack 14 and 22 and the bottom of the opening 26 is defined by the ESL 20. In one embodiment, pure chlorine gas in a plasma environment is used to etch the molybdenum layers 16 and silicon layers 18 in the upper multilayer reflective stack 22. In a preferred embodiment, an inductively coupled plasma (ICP) etch process is used.

By forming the opening 26, bright regions 28 and a dark region 30 are beginning to be formed, as shown in FIG. 2. The bright regions 28 are regions of the APSM 10 that will desirably reflect more light than the dark region 30. In a preferred embodiment, the reflectivity of radiation from the top plane 31 of the APSM 10 of the dark region 30 is approximately 3% to 20%, or more preferably 3 to 10%, or more specifically about 6% of the reflectivity of the bright region 28. As will be explained later in regards to FIG. 6, radiation reflected from the bright regions 28 exposes positive photoresist, wherein radiation reflecting from the dark region 30 does not expose positive photoresist. (The reverse is true if negative photoresist is used instead.) In other words, the location of the opening 26 corresponds to a region where lower reflectivity than that provided by the upper reflective stack 22 is desired. In addition, radiation reflected off of the dark region 30 is one hundred and eighty degrees out of phase with the radiation reflected off of the bright regions 28. Thus, the number of periods for each of the lower and upper reflective stacks 14 and 22 is determined at least in part by a requirement that EUV radiation reflected in the dark region 30 is one hundred and eighty degrees out of phase with respect to EUV radiation reflected in the bright regions 28.

Figure 3:
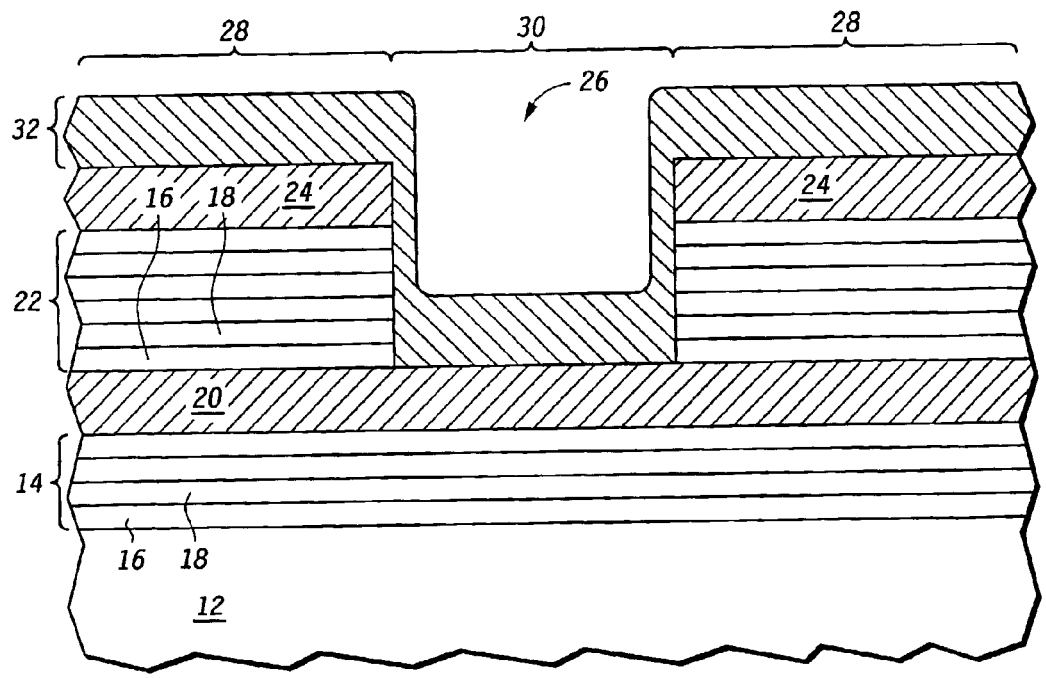
FIG. 3 illustrates the portion of the EUV mask of FIG. 2 after forming an optional absorber layer.

After forming the opening 26, an absorber (layer) 32 is optionally deposited over the APSM 10, as shown in FIG. 3. The percent absorbance of the absorber 32 is dependent upon the material chosen and its thickness. In one embodiment, the absorber 32 should have a transmission of less than approximately 25% at a thickness of less than 50 nanometers. The absorber 32 can include chromium, ruthenium, chrome oxide, chrome nitride, tantalum nitride, tantalum silicon nitride, the like or combinations of the above formed by PVD, CVD, the like, or combinations of the above processes. The thickness of the absorber 32 and the ESL 20 ($t_{abs/ESL}$) can be estimated using the following equation assuming that the same material is being used for the absorber 32 and the ESL 20, reflectivity of the lower multilayer reflective stack 14 is approximately 45% and only a single ray of light is transmitted and reflected back:

$$t_{abs/ESL} \cong -\lambda/(8*\pi*\beta)*\ln(R/0.45) \qquad \text{(equation 7)},$$

where $\lambda$ is the wavelength of the radiation used in the lithographic process, $\pi$ is approximately 3.14159, $\beta$ is the extinction coefficient of the absorber 32, ln is the natural logarithm function, and R is the desired ratio of the reflectivity of the dark region 30 to the bright region 28, which is approximately 3 to 20%. In an embodiment where the absorber 32 is chromium, $\lambda$ is approximately 13.4 nanometers and the desired ratio of R is 3%. Thus, $t_{abs/ESL}$ is approximately 38 nanometers, which includes the thickness of the ESL 20. If instead the material chosen for the absorber 32 and the material chosen for the ESL 20 are different, then the characterization matrix for each constituent material as described in equations 2–4 should be calculated for the absorber 32 in addition to the calculations for the ESL 20.

The presence of the absorber 32 will affect the reflectivity. In other words, the absorber 32 can be added to achieve the desired reflectivity ratio. However, the thickness of the absorber 32 affects both reflectivity and degree of phase shifting in the dark region 30. Therefore, the thickness of the absorber 32, the number of periods (molybdenum and silicon pairs) in the upper reflective layer 22 and the lower reflective layer 14 need to be considered together to achieve the desired reflectivity and phase shifting of the APSM 10. The exact thickness required for the right amount of attenuation and phase shift can be solved by a computer program using electromagnetic wave theory and the equations 1–6. The total thickness of chromium for the absorber 32 and the ESL 20 calculated by this method is about 36 nm with approximately 1.2 nm tolerance for 180±5 degrees phase shift.

If chromium is used as the absorber 32, it is likely that the thickness of the absorber will be between 15 and 45 nanometers. It is possible that the number of periods in the upper reflective stack 22 will vary from approximately 20 to 30 periods depending on the thickness of the absorber. Since the total number of periods of the upper reflective stack 22 and the lower reflective stack 14 is preferably 40, the lower reflective stack 14 will probably include approximately 10 to 20 periods.

In a preferred embodiment with an absorber 32 thickness of approximately 30 nm, the number of periods in the upper reflective stack 22 is twenty-six. In other words, the bright regions 28 have twenty-six additional periods of the first alternating layer 16 and the second alternating layer 18 than the dark region 30. Stated differently, the ESL 20 is embedded twenty-six periods below the top of the EUV mask, which is also the top of the combined reflective stacks 14 and 22. Thus, in a preferred embodiment, the upper reflective stack 22 includes twenty-six periods of the alternating layers 16 and 18 and the lower reflective layer stack 14 includes fourteen periods of the alternating layers 16 and 18.

After forming the absorber 32, a photoresist layer 34 is formed over the APSM 10. (The photoresist layer 34 as formed prior to patterning is not shown in the figures.) In one embodiment, the photoresist layer 34 is applied as a single layer. In another embodiment, the photoresist layer is multicoated. The main purpose of multicoating of photoresist is to planarize the three dimensional topography of the patterned surface. In order to perform multicoating, the viscosity of the photoresist needs to be reduced, so that it can easily fill in the opening area and the thickness for each coating can be maintained relatively thin (e.g., about 200 nanometers). The viscosity of a photoresist can be reduced by adding a solvent, such as ethyl lactate or propyleneglycol monomethyl etheracetate (PGMEA).

The thickness of each layer of the photoresist can be controlled both by the viscosity of photoresist and the spinning speed during multicoating. For conformal application of the photoresist, a spin coater having programmable speed control is desirable, by which the initial spin speed is maintained very slow (e.g., about 300 rpm for 10 seconds) and the final speed can be increased until the desired thickness is formed. The total thickness is the sum of each spin coating process.

Figure 4:
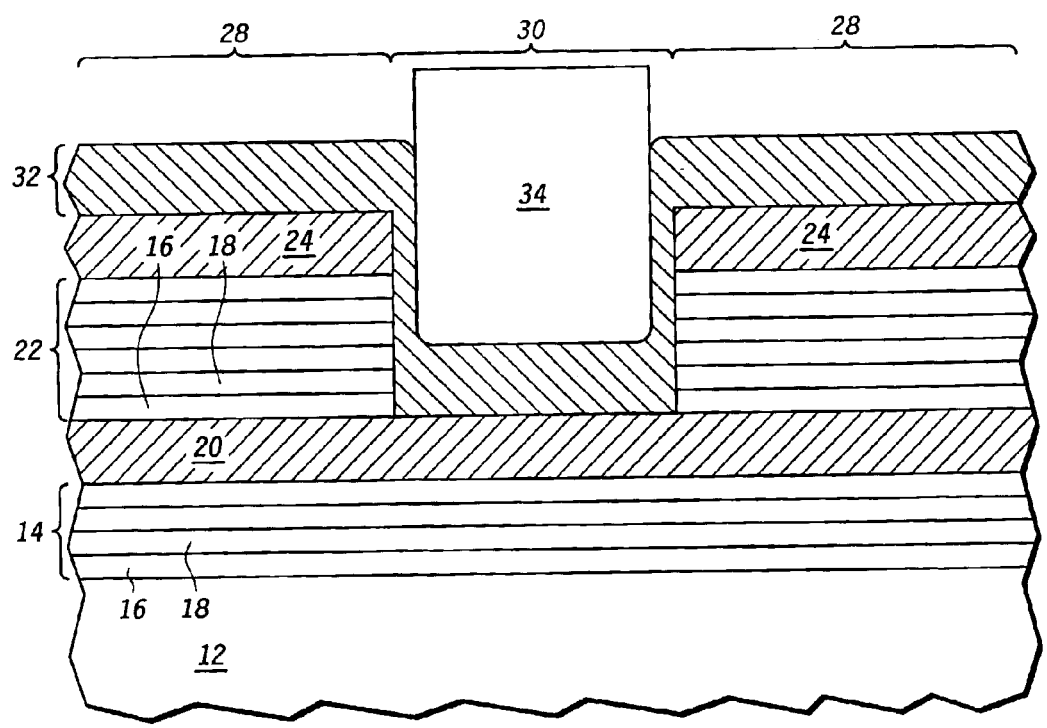
FIG. 4 illustrates the portion of the EUV mask of FIG. 3 after patterning a photoresist layer.

As shown in FIG. 4, the photoresist layer 34 is patterned (e.g., dry etched using oxygen) to expose portions of the absorber 32 within the bright regions 28 and, preferably, portions of the absorber 32 that lie on sidewalls of the opening 26. In other words, the photoresist layer 34 is patterned to leave portions of the photoresist layer 34 in the opening 26

Figure 5:
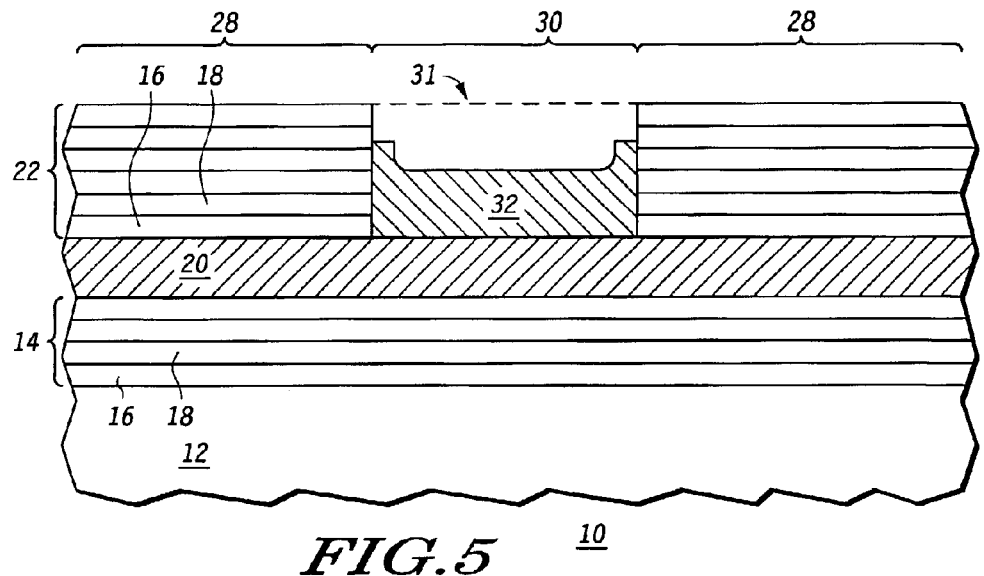
FIG. 5 illustrates the portion of the EUV mask of FIG. 4 after removing a portion of the absorber layer and the photoresist layer.

The photoresist layer 34 is used as a mask to etch exposed portions of the absorber 32 and is then removed, as shown in FIG. 5. In one embodiment, an ash process (e.g., a dry etch using an oxygen plasma) is used to remove the photoresist layer 34. It is desired that portions of the absorber 32 lying at the bottom of the opening 26 remain and all other portions be removed, especially the absorber 32 on the sidewalls of the opening 26 if the absorber 32 is thick compared to the thickness of the absorber on the bottom of the opening 26. In this embodiment, not removing the portions of the absorber 32 on the sidewalls of the opening can result in poor image contrast. However, it may be difficult to remove some or all of the absorber 32 located on the sidewalls of the opening 26. To aid in the removal, an overetch can be performed that will decrease the height of the absorber 32 on the sidewalls so that it is not coplanar with the top of the upper reflective stack 22, as shown in FIG. 5. If the thickness of the absorber 32 on the sidewalls of the opening 26 is small (e.g., less than approximately 10 Angstroms) and uniform, the presence of the absorber 32 on the sidewalls of the opening 26 may not be undesirable as it may help increase contrast between the bright regions 28 and the dark region 30. The ESL 20 and the absorber 32, together, desirably decrease the reflectivity of the light in the dark region 30.

In an embodiment where the hardmask 24 and the exposed portions of the absorber 32 are chromium, they are removed using a gas including chlorine and oxygen. In a preferred embodiment, a gas ratio of chlorine to oxygen is approximately 5:1, which may vary depending on the etch tool used. The presence of oxygen makes the process selective to chromium so that the top most layer of the upper multilayer reflective stack 22 is not removed. It is speculated that the addition of the oxygen reacts with the top most layer of the upper multilayer reflective stack 22 if it is silicon and forms silicon dioxide that cannot be etched using chlorine.

In an alternate embodiment, removing chromium of both the hard mask 24 and the absorber 32 can be done by a wet etch process rather than a dry etch process (e.g., using a gas). After the removal of the photoresist layer 34 from the bright regions 28, the exposed absorber 32 and hardmask 24 can be removed using a ceric ammonium nitrate solution if both are chromium. This process also desirably removes of a portion of the absorber 32 on the sidewall of the opening 26, as shown in FIG. 5. The eventual height of chromium on the sidewall can be controlled by the total thickness of chromium (the hard mask 24 and the absorber 32) and the amount of overetch time during wet etching.

In another embodiment, a lift-off technique could be used to remove the mask 24 after forming the opening 26. Prior to depositing the absorber 32, a photoresist layer is deposited and patterned as to expose areas of the APSM 10 where the absorber 32 is to be formed. The absorber 32 is then deposited over the entire wafer. The photoresist is removed (lifted-off) so that the absorber 32 remains only within the opening 26. One potential problem with this technique is that the lift-off process may cause defects on the APSM 10.

Another approach that could be used is electroplating the absorber 32 in the opening 36, however, it may be difficult to control the thickness of the absorber 32 and as will be explained in more detail below, the thickness of the absorber 32 determines the reflectivity of the dark region 30. Thus, electroplating the absorber 32 may not provide the process margin needed to achieve the reflectivity requirements desired for the APSM 10.

A skilled artisan should recognize that by using different parameters (materials, wavelengths, etc.), the number of periods in the upper reflective stack 22, the thickness of the absorber and the ESL, etc. may vary from those provided herein.

In one embodiment, a verification process is performed after determining the number of periods in the upper reflective stack 22. Curves illustrating the relationship between the reflectivity of the lower reflective stack 14, the ESL 20, and the absorber 32 in the dark region 30 can be graphed versus the number of periods in the upper multilayer reflective stack 22 for various absorber 32 thicknesses. For a given absorber 32 thickness, which is previously calculated using equation (7) and a given number of periods in the upper reflective stack 22 found from equations 1–6, the reflectivity of the periods in the dark region 30 is determined. This reflectivity should be approximately 3 to 20 percent of the reflectivity of the bright regions 28. If it is not, the calculations should be re-examined for an error.

Figure 6:
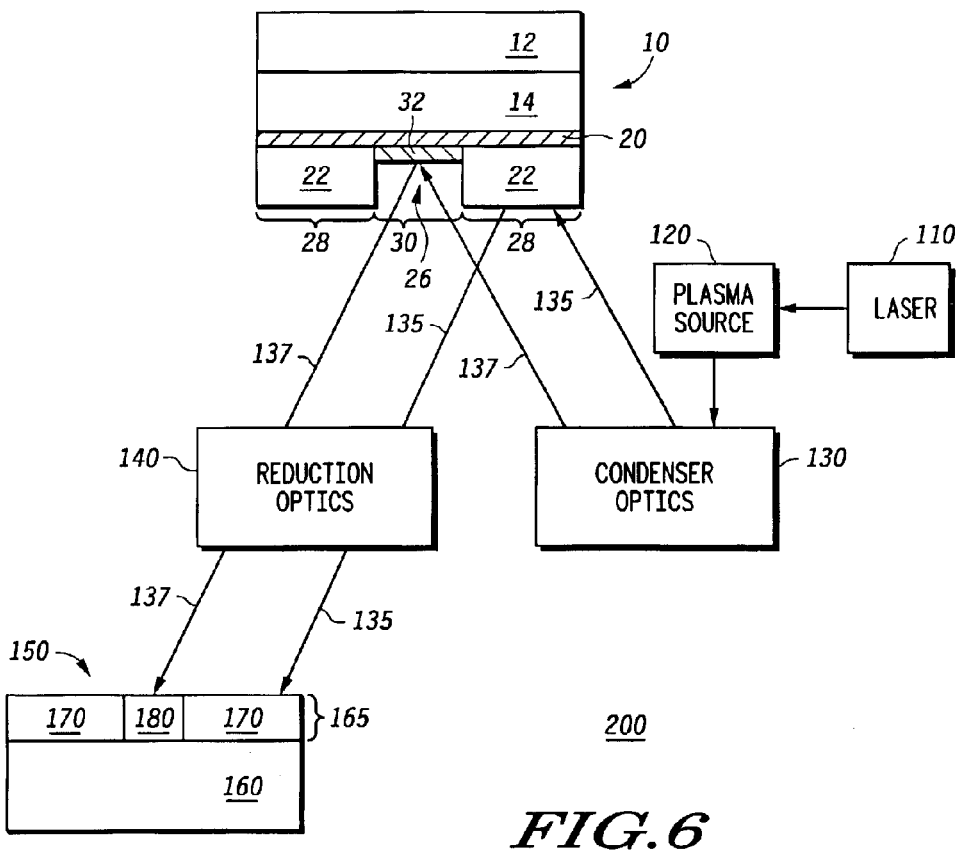
FIG. 6 illustrates using the EUV mask of FIG. 5 to pattern a semiconductor device.

Shown in FIG. 6 is an EUV (lithographic) system 200 for using the EUV mask 10 to pattern a semiconductor wafer or device 150. The EUV system 200 includes a laser 110, a plasma source 120, condenser optics 130, the APSM 10, reduction optics 140 and the semiconductor device 150. Although a variety of sources can provide EUV radiation, a laser produced plasma source 120 is shown. The source uses a high powered pulsed laser 110, such as Nd:YAG, for activating a supersonic gas jet, such as xenon gas jet. The xenon atomic clusters are heated to high temperatures resulting in the formation of a plasma source 120.

From the plasma source 120 radiation with a wavelength in the EUV regime is emitted and focused by the condenser optics 130 into collimated light or radiation 135 and 137. The collimated light 135 is projected onto the mask 10 at an angle, which is typically approximately 5 degrees with respect to the perpendicular axis of the mask 10, and reflected. The light 135 that is reflected off of the bright region 28, as previously discussed, has approximately 5–30 times more intensity than the light 137 that is reflected off of the dark region 30. In addition, the light 137 that reflects off of the dark region 30 is 180 degrees out of phase relative to the light 135 reflected off of the bright regions 28, as designed by optimizing the thickness of the ESL 20, the absorber 32 and the number of periods in the upper reflective stack 22 and the lower reflective stack 14. The reflected light travels through reduction optics 140, which reflect the light in order to shrink the pattern on the mask 10. Typically, the reduction optics 140 reduces the pattern on the mask 10 by four or five times. From the reduction optics 140, the light 135 and 137 illuminates a photoresist layer 165 on the semiconductor device 150.

The semiconductor device 150 includes the photoresist layer 165 and a semiconductor substrate 160, which is preferably monocrystalline silicon, but can be any other semiconductor material such as gallium arsenide, germanium, or the like. The semiconductor substrate 160 may have any number of layers or structures formed within the semiconductor substrate 160 or under the photoresist layer 165. If the photoresist layer 165 is positive, the non phase-shifted light 135 will expose a first area 170 and the phase shifted light 137 will not expose the second areas 180 of the photoresist layer 165. If negative photoresist is used, the opposite scenario will occur.

Other materials than those described above may be used for the layers on the APSM 10. For example, the lower reflective stack 14 and the upper reflective stack 22 may include a multilayer reflective stack of beryllium and molybdenum or any other layer or layers with suitable reflectivity. Alternatively, the material combination of alternating pairs for the upper reflective stack 22 could be different from that of the lower reflective stack. It is preferable that the materials chosen for the upper reflective stack 22 are more easily etched than those of the bottom reflective stack 14, if different materials are used for the upper reflective stack 22 and the lower reflective stack 14. In addition, a capping layer can optionally be formed over the upper reflective stack 22 to protect the materials in the upper reflective stack 22 against oxidation.

The APSM 10 described above generates a pattern on a semiconductor wafer 150 that has a print bias that is close to ideal. The print bias is determined by measuring the width of a feature on a semiconductor wafer after photolithography to form the feature using a tool, such as an scanning electron microscope (SEM) or the like, and subtracting the width of the feature from the desired width of the feature based on design requirements that were used to form the mask used during the photolithographic process. Thus, if a pattern in the APSM 10 is designed to print 40 nm in width and when printed on the semiconductor wafer the pattern is 40 nm, the print bias is ideal or equal to zero. If instead, width of the printed pattern on the semiconductor wafer 150 is 45 nm, the print bias is 5 nm. Work has shown that using the APSM 10 described above a print bias of approximately 1.5 nm is achieved at an energy dose where depth of focus is maximized, whereas the print bias for prior art structures is 5 to 15 nm. Print bias can be compensated by changing the width of the patterned bright regions 28 and dark regions 30 on the APSM 10. However, having a small print bias makes the pattern on the APSM 10 easier to fabricate. One way to accommodate for a poor print bias is to decrease the width of patterns, however this creates smaller structures on the APSM 10, which is harder to manufacture. The advantage of a small print bias (e.g., less than 5 nanometers) is most apparent when the widths of the first area 170 and the second area 180 are nearly the same or when the width of the second area 180 becomes small (e.g., less than 50 nanometers).

Furthermore, a depth of focus improvement of approximately 25 to 75% is achieved when patterning contacts. While all APSMs have a depth of focus improvement, the APSM 10 described herein has a more improved depth of focus because etching into the upper reflective layer 22 reduces the diffraction of light that occurs when light travels through a non-reflective layer lying on top of the upper reflective stack 22 and then into the upper reflective stack 22. Since no additional layers are present over the upper multilayer reflective stack 22, the diffraction is decreased in these areas, thereby increasing the depth of focus. Even if a capping layer, which generally has a thickness of 10 nm or less, is formed over the upper reflective stack 22, because diffraction is still decreased over having many thicker layers over the reflective stack that total approximately 100 nm in thickness because the capping layer is thin. Additionally, the depth of focus is improved because there are fewer multilayers beneath the absorber 32 than if the absorber 32 were patterned on top of the multilayer stack 22.

In addition using the APSM 10 described, aerial image asymmetry due to off-axis illumination is reduced. Furthermore, by using the processing methods described above, the surface of the upper multilayer reflective stack is protected during etching of the opening by an etch mask, thereby decreasing damage of the surface during this process.

For manufacturing the HPSM, the light intensity from the dark region 30 should be almost the same as that from the bright regions 28. (Hence, the dark region 30 and the bright regions 28 are more suitable called the etched stack region 30 and the unetched stack regions 28 in the embodiment where the EUV mask is the HPSM.) In addition, the etched stack region 30 and the unetched stack regions 28 should be designed so that the light reflected off of both regions is 180 degrees out of phase with each other. This means that both the unetched stack regions 28 and the absorber stack regions 30 reflect most of the light from the source.

The process described above for forming the APSM, differs for forming the HPSM, mainly in that the absorber 32 is not needed for the HPSM. However, for HPSM a HPSM absorber layer may be formed and patterned over the unetched stack regions 28 to remove unwanted phase shift artifacts or to print large dark regions. The absorber layer 32 and the HPSM absorber layer server different purposes. The absorber 32 is formed in the opening 26 to decrease the intensity of light reflected from the opening 26 of the APSM 10. The HPSM absorber layer instead is formed over the unetched stack regions 28 to achieve the desired opacity of the HPSM. For example, the HPSM absorber layer reflects less than 0.5% of incident EUV radiation intensity. The HPSM absorber layer formed over the unetched stack regions 28 of the combined reflective stack 14 and 22 is preferably vacuum compatible, stable with EUV radiation, thermally conductive, and has an emissivity substantially matched with the combined reflective stack 14 and 22. In one embodiment, the HPSM absorber layer includes tantalum, tantalum silicon, tantalum nitride, tantalum silicon nitride, chromium, chromium nitride, and chromium oxynitride. For most of the candidate materials about 60–80 nm is the optimum thickness for the HPSM absorber layer. Optionally, a repair buffer layer (e.g., carbon or silicon oxynitride) and a HPSM etch stop layer (e.g., chromium or carbon) can be formed under the HPSM absorber layer and over the combined reflective stack 14 and 22 to reduce damage to the combined reflective stack 22 and 14 when patterning the HPSM absorber layer, repair buffer and HPSM etch stop layer.

In addition, the number of layer pairs in the combined reflective stack 14 and 22 may differ in the HPSM from the APSM. The desired intensity ratio between the unetched stack regions 28 and the etched stack region 30 determines the number of layer pairs for the HPSM. Since once the number of periods equals or exceeds 45, the reflectivity reaches a saturation level, any number of periods greater than 45 does not substantially increase the reflectivity. Thus, for an ideal ratio of reflectivity between the unetched stack regions 28, which includes the combined reflective stack 14 and 22 and the ESL 20, and the etched stack region 30, which includes the lower reflective stack 14 and, possibly, the ESL 20, the lower reflective stack 14 should have at least 45 pairs. Therefore, no matter how many reflective layers are added over the lower reflective stack 14 (i.e. how many layers are in the upper reflective stack 22), the unetched stack regions 28 and the etched stack region 30 will have substantially the same reflectivity.

The number of layers in the upper reflective stack 22 for the HPSM is determined using the same calculation routine as for the APSM design. For the HPSM, one hundred and eighty (180) degree phase shift can be achieved when 6.5 nm of boron carbide ($B_4C$) is embedded under 17 periods of the upper reflective stack 22. The depth of the ESL 20 for the HPSM (17 periods) from the upper reflective stack 22 is shallower than in the case of the APSM (26 periods) because the extra layer of absorber 32 of the APSM is not necessary in the HPSM. The thickness of the ESL layer 20 for the HPSM embedded in the combined reflective stack 14 and 22 can be calculated using the same equations as for the APSM. Furthermore, the same materials used for the ESL 20 for the APSM can be used to form the HPSM. However, the materials chosen for the ESL 20 of the HPSM should also have a high transmission for EUV radiation to allow enough reflectivity from the etched stack region 30. This means that the extinction coefficient of the embedded material for the HPSM should be smaller than that for the APSM. For example, the reflectivity of the etched stack region 30 should be greater than 85% of the reflectivity of the unetched stack regions 28. Preferably, the ESL 20 of the HSPM is a highly transparent material that imparts a small amount of attenuation. Suitable materials for the (HPSM) ESL 20 may include $B_4C$, Zr and SiON. In a preferred embodiment where the HPSM includes 6.5 nm of boron carbide as the ESL 20 embedded under 17 periods of the upper reflective stack 22, the ratio of reflectivity between the etched stack region 30 and unetched stacked region 28 is 0.92. The reflectivity of the etched stack region 30 of the HPSM for three different thickness values of boron carbide layers depends on the depth of the embedded layer from the top upper reflective layers.

In an alternate embodiment, the ESL 20 is removed in the opening formed by removing the upper reflective stack 22 to increase the reflectivity of this region. In other words, the ESL 20 and the upper reflective stack 22 are removed within an opening to achieve the desired attenuation and so that the reflectivity in the opening is maximized by exposing the lower reflective stack 14.

As described above, due to the required opacity in the EUV regime, a material with high atomic weight such as tantalum, tantalum silicon, tantalum nitride, tantalum silicon nitride, chromium, chromium nitride, and chromium oxynitride is desirable for an absorber stack which can be formed on the unetched stacked region 28 of the HPSM.

Additionally, an antireflective coating (ARC) layer (e.g., a dielectric) can be formed over the HPSM absorber and patterned to increase contrast during mask inspection. The thickness of the ARC layer on top of the HPSM absorber layer should be optimized for minimum reflection for the wavelengths of the inspection tool, which is currently 365 nm and moving to approximately 250 or approximately 200 nm in the future. The calculation of optimum thickness of the ARC layer is a function of the optical constants of the ARC layer and underlying HPSM absorber layer, which can be obtained by spectroscopic ellipsometry. In a preferred embodiment, 30 nm of SiON deposited by plasma enhanced chemical vapor deposition (PECVD) is used as the ARC layer over 60 nm of the HPSM absorber layer including TaN. The SiON ARC layer provides excellent ARC performance, a contrast ratio higher than 85% during inspection, and the added benefit of acting as a hard mask during etching of the HPSM absorber layer.

Figure 7:
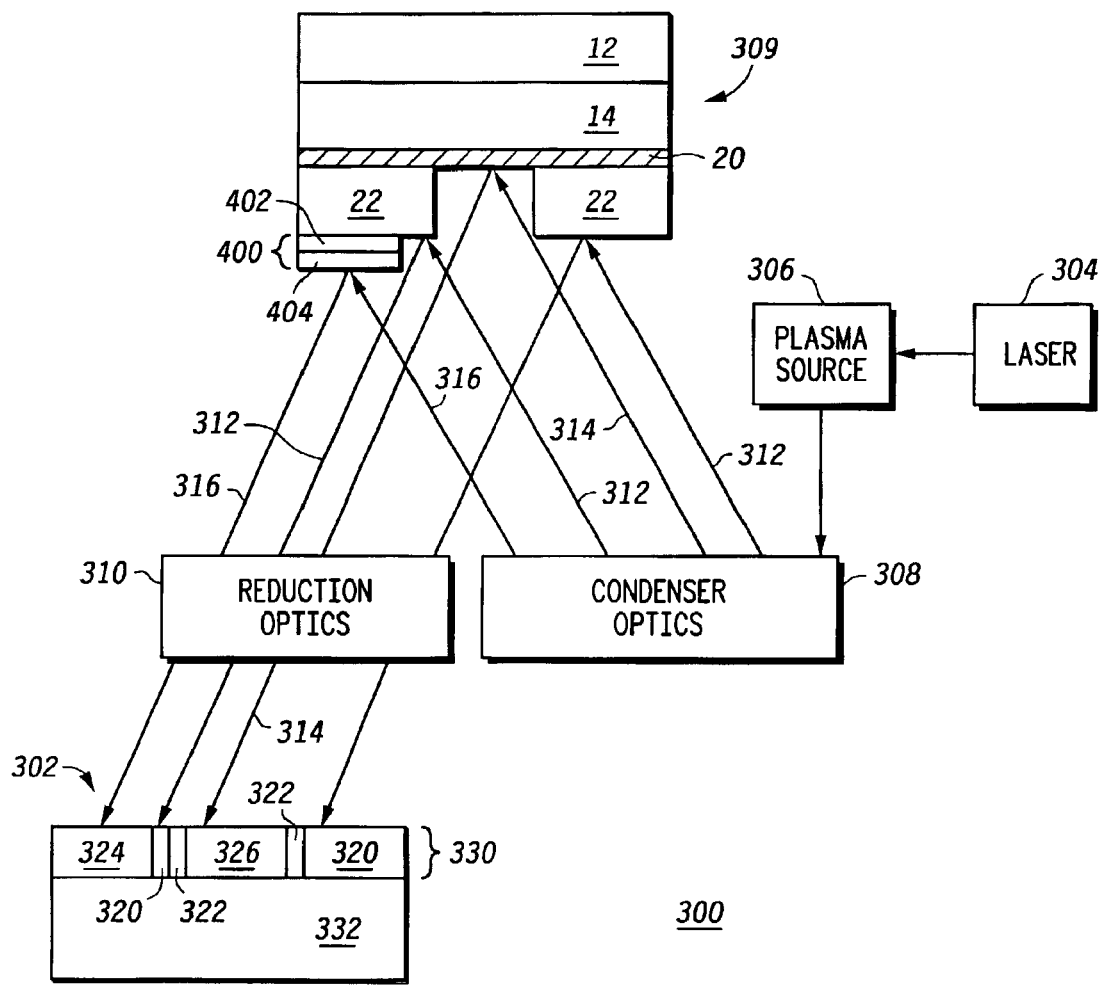
FIG. 7 illustrates using another EUV mask formed in accordance with an embodiment of the present invention to pattern a semiconductor device.

The HPSM manufactured by the above method can be used to pattern a semiconductor wafer or device 302 using an EUV (lithographic) system 300, as shown in FIG. 7. The EUV system 300 includes a laser 304, a plasma source 306, condenser optics 308, a HPSM 309, reduction optics 310 and the semiconductor device 302. In the embodiment shown, the HPSM 309 includes the semiconductor substrate 12, the lower reflective stack 14, the ESL 20, the upper reflective stack 22, which is patterned, and an absorber stack 400, which is also patterned. The absorber stack 400 includes an absorber layer 402 (e.g., 60 nm of TaN and an ARC layer 404 (e.g., 30 nm of SiON). The absorber stack 400, which is optional, is patterned to cover portions of the upper reflective stack 22 to remove unwanted phase shift artifacts or to print large dark regions, as previously discussed, based on the desired pattern.

Although a variety of sources can provide EUV radiation, a laser produced plasma source 306 is shown. The source uses a high powered pulsed laser 304, such as Nd:YAG, for activating a supersonic gas jet, such as xenon gas jet. The xenon atomic clusters are heated to high temperatures resulting in the formation of a plasma source 306. From the plasma source 306 radiation with a wavelength in the EUV regime is emitted and focused by the condenser optics 308 into collimated light or radiation 312, 314, and 316. The collimated light 312, 314 and 316 are projected onto the HPSM 309 at an angle, which is typically approximately 5 degrees with respect to the perpendicular axis of the HPSM 309, and reflected. Before impacting the semiconductor device 302, the reflected light travels through reduction optics 310, which reflect the light in order to shrink the pattern on the HPSM 309. Typically, the reduction optics 310 reduce the pattern on the HPSM 309 by four or five times. From the reduction optics 310, the light 312, 314 and 316 illuminates a photoresist layer 330 formed over a the semiconductor substrate 332.

The semiconductor device 302 includes the photoresist layer 330 and a semiconductor substrate 332, which is preferably monocrystalline silicon, but can be any other semiconductor material such as gallium arsenide, germanium, or the like. The semiconductor substrate 332 may have any number of layers or structures formed within the semiconductor substrate 332 or under the photoresist layer 330.

The light 312 that is reflected off of the upper reflective stack 22 forms imaged regions 320, which are bright regions. The light 314 that reflects off of the ESL 20 is imaged to form region 326, which is a bright region, on the semiconductor device 302. The light 316 that is reflected off of the absorber stack 400 forms region 324, which is a dark region, on the semiconductor device 302. The light 312 and 314 reflected from the upper reflective stack 22 and the ESL 20, respectively, destructively interfere with each other and for dark regions 322. The dark regions 322 are the boundaries between the bright regions 320 and 326 that provide contrast to enhance pattern being printed. The ratio of the intensity of the light used to form bright region 326 and bright region 320 should be greater than 0.85, and ideally 1. Because the reduction optics 310 are not ideal due to diffraction and aberrations of the optics, the transitions between regions 324, 320, 322 and 326 are not abrupt. The above description occurs if the photoresist layer 330 is positive; if negative photoresist is used, the bright regions will be dark regions and vice versa.

By forming an HPSM having an ESL embedded in the combined reflective layer enables a simplified manufacturing process. The presence of the ESL decreases the damage that can occur to the lower reflective stack 14 when removing the upper reflective stack 22. The method described above provides for a subtractive method of forming a HPSM used for EUV lithography where both 180 degrees of phase shift and equal amount of light intensity between the unetched stack regions 28 and the etched stack region 30.

The above equations can be performed manually or can be automated. In the latter embodiment, software can be developed that efficiently optimizes the thickness of the absorber 32, the number of periods in the upper multilayer reflective stack 22, and the thickness of the ESL 20, the like, or combinations of the above.

In the foregoing specification, the invention has been described with reference to specific embodiments. However, one of ordinary skill in the art appreciates that various modifications and changes can be made without departing from the scope of the present invention as set forth in the claims below. As described above various regions of the APSM and the HPSM are 180 degrees out of phase with each other. In reality, the regions may not be exactly 180 degrees out of phase. However, they will be substantially 180 degrees out of phase with each other. For example, the regions may be 175 or 185 degrees out of phase with each other. Accordingly, the specification and figures are to be regarded in an illustrative rather than a restrictive sense, and all such modifications are intended to be included within the scope of present invention.

Moreover, the terms front, back, top, bottom, over, under and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The term coupled, as used herein, is defined as connected, although not necessarily directly, and not necessarily mechanically. The term program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

What is claimed is:

1. A reflective mask useful for transferring a pattern to a semiconductor substrate comprising:
   a mask substrate;
   a reflective stack formed directly on the mask substrate, wherein an uppermost surface of the reflective stack defines a top plane of the mask;
   an embedded etch stop layer embedded within the reflective stack, and wherein a bottom of the opening is defined by the embedded etch stop layer; and
   an opening formed partially through the reflective stack from the top plane, wherein the opening location corresponds to a region where lower reflectivity than that provided by the reflective stack is desired.

2. The reflective mask of claim 1 wherein the reflective stack comprises a stack of alternating first and second layers, wherein a material of the first layer is a transmissive material and a material of the second layer has an index of refraction substantially different than an index of refraction of the material of the first layer.

3. The reflective mask of claim 2 wherein the stack of alternating layers comprises alternating layers of molybdenum and silicon.

4. The reflective mask of claim 1 further comprising an absorber layer formed over the embedded etch stop layer within the opening.

5. The reflective mask of claim 4 wherein the embedded etch stop layer and absorber layer each comprise chromium.

6. A reflective mask useful for transferring a pattern to a semiconductor substrate comprising:
   a mask substrate;
   a lower multilayer reflective stack formed directly on the mask substrate;
   an etch stop layer formed on the tower multilayer reflective stack;
   an upper multilayer reflective stack formed over the etch stop layer;
   an opening formed through the upper multilayer reflective stack and exposing the etch stop layer; and
   an absorber layer formed over the etch stop layer within the opening.

7. The reflective mask of claim 6, wherein the etch stop layer has a thickness of approximately $\lambda \cos \theta/(2n)$, wherein $\lambda$ is a wavelength of EUV radiation to be used; n is an index of refraction of the etch stop layer; and $\theta$ is an angle of incidence of EUV radiation on the reflective mask to be used.

8. The reflective mask of claim 6 wherein:
   the opening corresponds to a dark region;
   areas of the upper multilayer reflective stack adjacent the opening correspond to bright regions;
   the upper multilayer reflective stack defines a top plane of the reflective mask; and
   the thickness of the absorber layer is chosen so that reflection of EUV radiation at the top plane within the opening is 3–20 percent of reflection of EUV radiation at the top plane within the upper multilayer reflective stack.

9. The reflective mask of claim 8 wherein the lower and upper multilayer reflective stacks each comprise periods of alternating layers of different materials, and wherein a number of periods for each of the lower and upper multilayer reflective stack is determined, at least in part, by a requirement that EUV radiation reflected in the dark region is approximately 180° out of phase with respect to EUV radiation reflected in the bright region.

10. The reflective mask of claim 6 wherein the absorber layer comprises chromium.

11. The reflective mask of claim 6 wherein the absorber layer has a thickness of between approximately 10 to 50 nanometers.

12. The reflective mask of claim 6 wherein the etch stop layer comprises a material selected from a group consisting of chromium, ruthenium, chrome oxide, chrome nitride, boron carbide, zirconium, tantalum oxide, tantalum nitride, tantalum silicon nitride.

13. The reflective mask of claim 6 wherein the etch stop layer comprises chromium.

14. The reflective mask of claim 6 wherein the etch stop layer has a thickness of between approximately 5 to 20 nanometers.

15. The reflective mask of claim 6 wherein the lower and upper multilayer reflective stacks each comprise periods of alternating layers of different materials, and wherein a number of periods in the lower multilayer reflective stack is between 10 and 20.

16. The reflective mask of claim 15 wherein a number of periods in the upper multilayer reflective stack is between 20 and 30.

17. A method for making a reflective mask useful for transferring a pattern to a semiconductor substrate using extreme ultraviolet (EUV) radiation comprising:
   providing a mask substrate;
   forming a lower multilayer reflective stack directly on the mask substrate;
   forming an etch stop layer over the lower multilayer reflective stack;
   forming an upper multilayer reflective stack on the etch stop layer;
   etching an opening through the upper multilayer reflective stack to expose the etch stop layer; and
   forming an absorber layer formed over the etch stop layer within the opening.

18. The method of claim 17 wherein the absorber layer comprises chromium.

19. The method of claim 17 wherein forming a lower and an upper multilayer reflective stack each comprise forming a series of alternating first and second layers, wherein the first layer comprises a transmissive material and the second layer has an index of refraction substantially different than an index of refraction of the first layer.

20. The method of claim 19 wherein the series of alternating layers in each of the lower and upper multilayer reflective stacks comprises alternating layers of molybdenum and silicon.

21. The method of claim 19 wherein a combination of one first layer and one second layer constitutes a period, and a number of periods in the lower multilayer reflective stack is between 10 and 20.

22. The method of 19 wherein the etch stop layer is formed to have a thickness of approximately $\lambda \cos \theta/(2n)$, wherein $\lambda$ is an wavelength of EUV radiation to be used; n is an index of refraction of the etch stop layer; and $\theta$ is an angle of incidence of EUV radiation on the reflective mask.

23. The method of claim 17 wherein the absorber layer is formed to have a thickness of between approximately 10 to 50 nanometers.

24. The method of claim 17 wherein the etch stop layer comprises a material selected from a group consisting of chromium, ruthenium, chrome oxide, chrome nitride, boron carbide, zirconium, tantalum oxide, tantalum nitride, tantalum silicon nitride.

25. The method of claim 24 wherein the etch stop layer comprises chromium.

26. The method of claim 24 wherein the etch stop layer has a thickness of between approximately 5 to 20 nanometers.

27. The method of claim 17 further comprising the step of forming a hardmask on the upper multilayer reflective stack, and wherein the step of etching an opening comprises etching an opening using the hardmask as an etch mask.

28. The method of claim 27 wherein the hardmask comprises chromium.

29. A method for patterning a photoresist layer on a semiconductor substrate using a reflective mask comprising providing a semiconductor substrate;

forming a photoresist layer over the semiconductor substrate;

providing a reflective mask, the reflective mask comprising:
  a mask substrate;
  a lower multilayer reflective stack formed directly on the mask substrate;
  an etch stop layer formed on the lower multilayer reflective stack;
  an upper multilayer reflective stack formed over the etch stop layer;
  an opening formed through the upper multilayer reflective stack and exposing the etch stop layer;
  an absorber layer formed over the etch stop layer within the opening projecting incident radiation on the reflective mask;

reflecting the incident radiation from the reflective mask as reflected radiation; and illuminating the photoresist layer with the reflected radiation.

* * * * *

UNITED STATES PATENT AND TRADEMARK OFFICE
CERTIFICATE OF CORRECTION

PATENT NO.         : 6,986,971 B2                                              Page 1 of 1
APPLICATION NO.    : 10/290693
DATED              : November 8, 2002
INVENTOR(S)        : Sang-In Han It is certified that error appears in the above-identified patent and that said Letters Patent is hereby corrected as shown below:

In Column 17, Line 42, Claim 6:
　　Change "tower" to --lower--

In Column 17, Line 51, Claim 7:
　　Change "$\lambda\cos\Theta/(2n)$" to --$\lambda\cos\Theta/(2n)$--

In Column 18, Line 63, Claim 22:
　　Change ""$\lambda\cos\Theta/(2n)$,"" to --"$\lambda\cos\Theta/(2n)$,--

Signed and Sealed this

Twenty-seventh Day of May, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,986,971 B2 |
| APPLICATION NO. | : 10/290693 |
| DATED | : January 17, 2006 |
| INVENTOR(S) | : Sang-In Han |

Page 1 of 1

It is certified that error appears in the above-identified patent and that said Letters Patent is hereby corrected as shown below:

In Column 17, Line 42, Claim 6:
    Change "tower" to --lower--

In Column 17, Line 51, Claim 7:
    Change "λcos ⊖/(2n)" to --λcos⊖/(2n)--

In Column 18, Line 63, Claim 22:
    Change ""λcos ⊖/(2n)," to --"λcos⊖/(2n),--

This certificate supersedes the Certificate of Correction issued May 27, 2008.

Signed and Sealed this

Twenty-fourth Day of June, 2008

JON W. DUDAS
*Director of the United States Patent and Trademark Office*